United States Patent
Sawabe et al.

(10) Patent No.: US 11,024,719 B2
(45) Date of Patent: Jun. 1, 2021

(54) SEMICONDUCTOR DEVICE AND PRODUCTION METHOD THEREOF

(71) Applicant: TOSHIBA MEMORY CORPORATION, Tokyo (JP)

(72) Inventors: Tomoaki Sawabe, Taito Tokyo (JP); Nobuyoshi Saito, Ota Tokyo (JP); Junji Kataoka, Kawasaki Kanagawa (JP); Tomomasa Ueda, Yokohama Kanagawa (JP); Keiji Ikeda, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/563,307

(22) Filed: Sep. 6, 2019

(65) Prior Publication Data

US 2020/0303554 A1  Sep. 24, 2020

(30) Foreign Application Priority Data

Mar. 18, 2019  (JP) .............................. JP2019-050393

(51) Int. Cl.
*H01L 29/423* (2006.01)
*H01L 29/786* (2006.01)
(Continued)

(52) U.S. Cl.
CPC .... *H01L 29/42392* (2013.01); *H01L 21/0262* (2013.01); *H01L 21/02554* (2013.01);
(Continued)

(58) Field of Classification Search
CPC ........... H01L 29/7869; H01L 21/02554; H01L 21/0262; H01L 29/4908; H01L 29/517; H01L 29/78609; H01L 27/10873–10879; H01L 27/2454; H01L 29/7827; H01L 21/823487; H01L 21/823885; H01L 27/10805; H01L 27/10808;
(Continued)

(56) References Cited

U.S. PATENT DOCUMENTS 6,140,167 A * 10/2000 Gardner ............ H01L 21/28079
257/E21.202
7,115,476 B1  10/2006 Izumida
(Continued)

FOREIGN PATENT DOCUMENTS

JP  2006-310651 A  11/2006
JP  2011-159908 A  8/2011
(Continued)

*Primary Examiner* — Scott B Geyer
(74) *Attorney, Agent, or Firm* — Foley & Lardner LLP

(57) ABSTRACT

A semiconductor device of an embodiment includes a first electrode, a second electrode, an oxide semiconductor channel, an insulation layer, an oxide layer, and a gate electrode. The oxide semiconductor channel includes a portion extending along a first direction and connects the first electrode to the second electrode. The insulation layer surrounds the oxide semiconductor channel. The oxide layer covers the oxide semiconductor channel and the insulation layer, and includes an oxide of a metal element. The gate electrode covers the oxide semiconductor channel, the insulation layer, and the oxide layer, and includes the metal element.

26 Claims, 10 Drawing Sheets

(51) Int. Cl.
*H01L 21/02* (2006.01)
*H01L 29/49* (2006.01)
*H01L 29/51* (2006.01)
*H01L 27/24* (2006.01)
*H01L 29/78* (2006.01)

(52) U.S. Cl.
CPC .... *H01L 27/2454* (2013.01); *H01L 29/42364* (2013.01); *H01L 29/4908* (2013.01); *H01L 29/517* (2013.01); *H01L 29/7827* (2013.01); *H01L 29/7869* (2013.01); *H01L 29/78609* (2013.01)

(58) Field of Classification Search
CPC ......... H01L 27/10814; H01L 27/10885; H01L 27/10891; H01L 29/24; H01L 29/247; H01L 29/42356–42392; H01L 21/02244
See application file for complete search history.

(56) References Cited

U.S. PATENT DOCUMENTS

| | | |
|---|---|---|
| 8,748,882 B2 | 6/2014 | Terai et al. |
| 9,202,822 B2 | 12/2015 | Endo et al. |
| 9,741,864 B2 | 8/2017 | Nabatame et al. |
| 2010/0244140 A1 | 9/2010 | Masuoka et al. |
| 2010/0264485 A1 | 10/2010 | Masuoka et al. |
| 2012/0049252 A1 | 3/2012 | Masuoka et al. |
| 2012/0264265 A1 | 10/2012 | Masuoka et al. |
| 2019/0296155 A1* | 9/2019 | Sawabe .............. H01L 27/10873 |

FOREIGN PATENT DOCUMENTS

| | | |
|---|---|---|
| JP | 2014-067885 A | 4/2014 |
| JP | 6205453 B2 | 9/2017 |
| JP | 6296463 B2 | 3/2018 |
| TW | 201036144 A | 10/2010 |
| TW | 201039394 A | 11/2010 |
| WO | WO-2010/106920 A1 | 9/2010 |

* cited by examiner

SEMICONDUCTOR DEVICE AND PRODUCTION METHOD THEREOF

CROSS-REFERENCE TO RELATED APPLICATIONS

This application is based upon and claims the benefit of priority from Japanese Patent Application No. 2019-050393, filed on Mar. 18, 2019; the entire contents of which are incorporated herein by reference.

FIELD

Embodiments relate to a semiconductor device and its production method.

BACKGROUND

An oxide semiconductor transistor with a channel layer of an oxide semiconductor has a relatively small channel leak current (off-leak current) during its off-state. A smaller off-leak current leads to a reduction in power consumption and an improvement in non-volatile performance of a semiconductor memory, for example.

However, an existing off-leak current is not necessarily small enough, and is preferably smaller. In particular, a threshold voltage of the transistor is preferably set to be 0 Volt or more (a positive shift of the threshold voltage) in extremely small off-leak current. This can reduce the off-leak current while the gate voltage being 0V.

DETAILED DESCRIPTION

A semiconductor device of an embodiment includes a first electrode, a second electrode, an oxide semiconductor channel, an insulation layer, an oxide layer, and a gate electrode. The oxide semiconductor channel includes a portion extending along a first direction and connects the first electrode to the second electrode. The insulation layer surrounds the oxide semiconductor channel. The oxide layer covers the oxide semiconductor channel and the insulation layer, and includes an oxide of a metal element. The gate electrode covers the oxide semiconductor channel, the insulation layer, and the oxide layer, and includes the metal element.

Hereinafter, embodiments of the present invention will be described with reference to the drawings.

Figure 1:
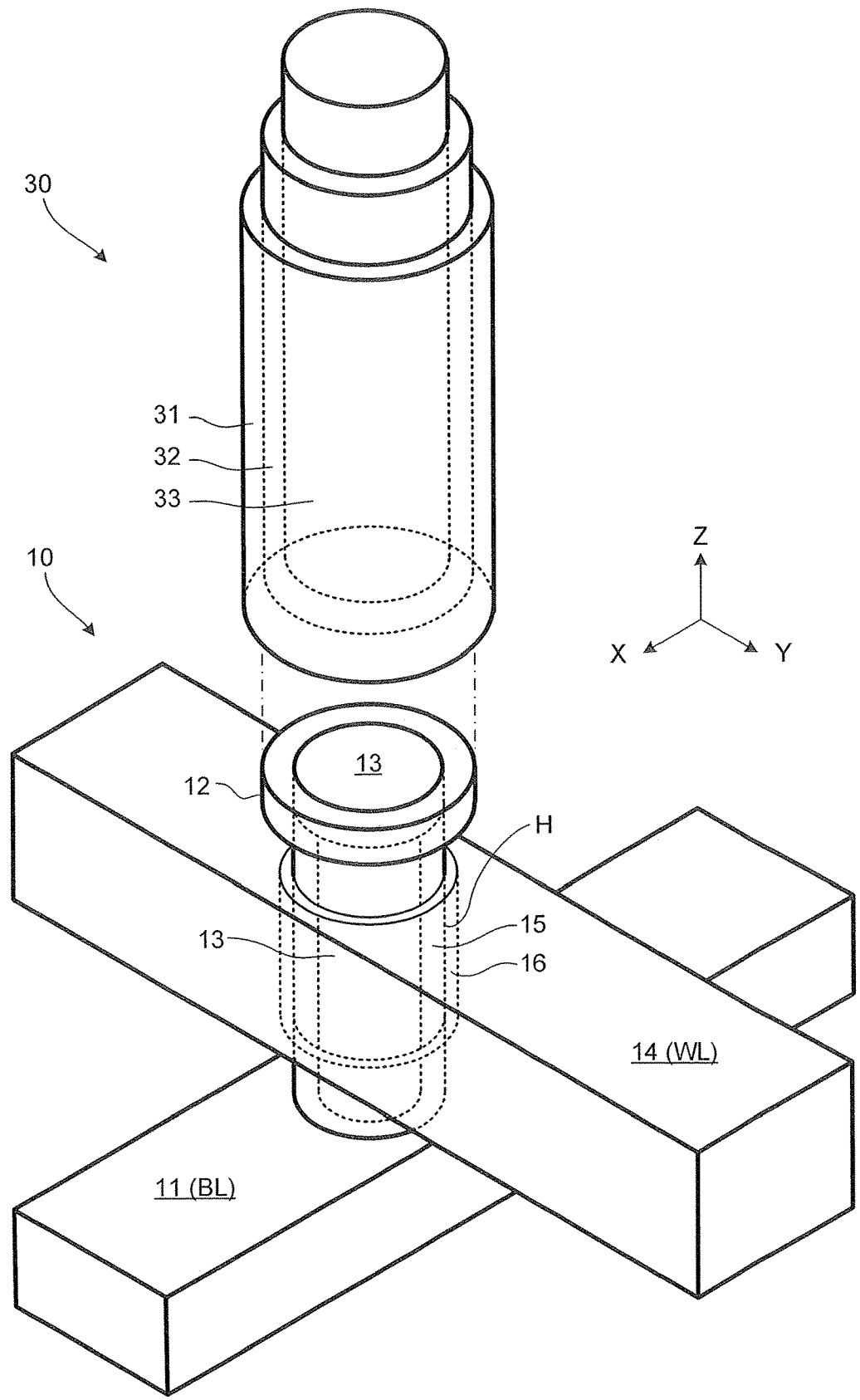
FIG. 1 is a perspective view schematically illustrating a semiconductor device according to an embodiment.
Figure 2:
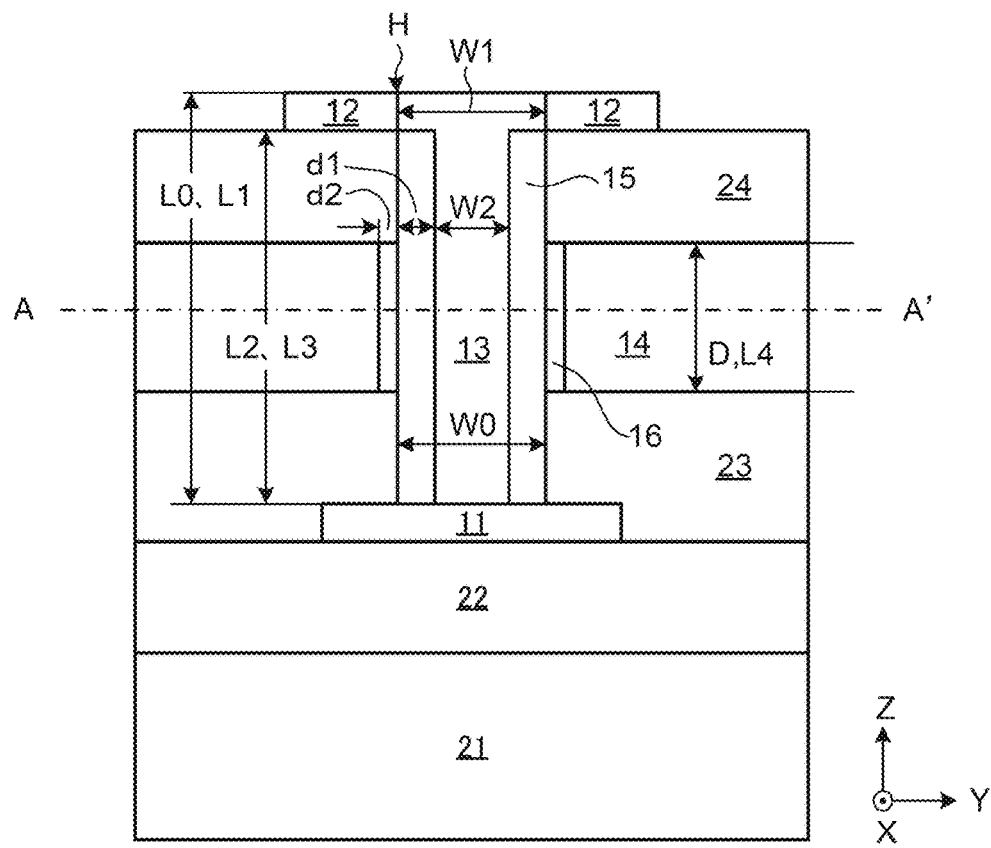
FIG. 2 is a vertical sectional view schematically illustrating the semiconductor device according to the embodiment.
Figure 3:
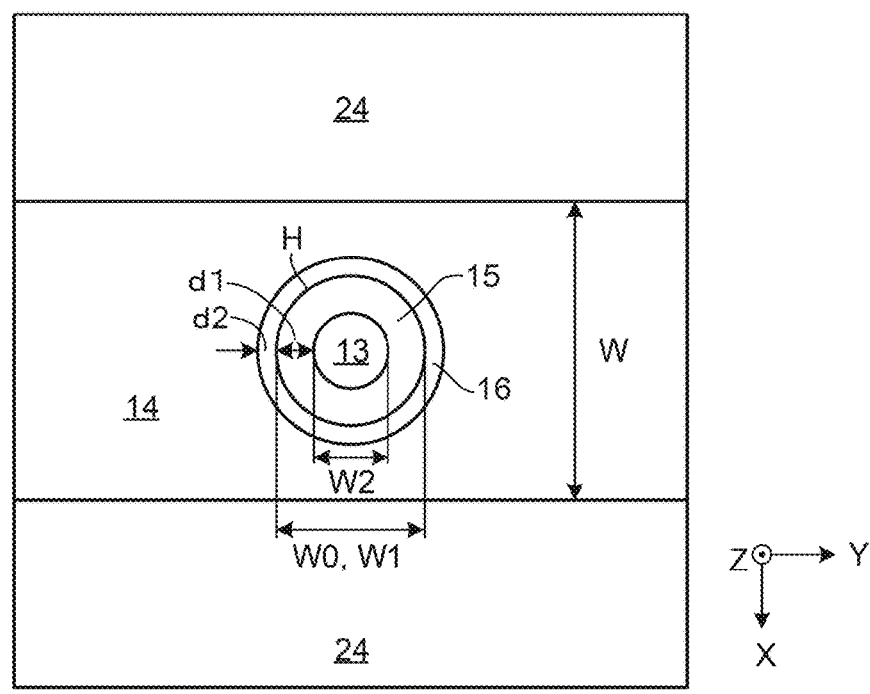
FIG. 3 is a cross sectional view schematically illustrating the semiconductor device.

FIG. 1 is a perspective view illustrating a semiconductor device (a memory cell) including a transistor 10 and a capacitor 30 connected to each other. FIG. 2 and FIG. 3 are a vertical and a cross sectional view schematically illustrating the transistor 10. FIG. 3 illustrates a cross section on the line A-A' in FIG. 2. For ease of viewing, FIG. 1 illustrates the transistor 10 and the capacitor 30 separately, and omits the description of the substrate 21 and the interlayer-insulation layers 22 to 24 described later.

The transistor 10 is an oxide semiconductor transistor having a channel layer 13 of an oxide semiconductor and is a so-called Surrounding Gate Transistor (SGT) in which a gate electrode 14 is disposed surrounding the channel layer 13. The transistor 10 is also a so-called vertical transistor in which a source electrode 11, a gate electrode 14, and a drain electrode 12 are arranged in the thickness direction (the Z-axis direction) of the substrate 21.

The capacitor 30 has a cell electrode 31, an insulation film 32, and a plate electrode 33. The cell electrode 31 is connected to the drain electrode 12 of the transistor 10. By operating the transistor 10 as a switching transistor of a dynamic random access memory (DRAM), charge is accumulated and held in the capacitor 30.

Arranging memory cells of FIG. 1 in a matrix can form a memory cell array. That is, a plurality of bit lines BL and a plurality of word lines WL are arranged along two directions, and each memory cell is arranged at a respective intersection of the lines BL and WL. By selecting a bit line BL and a word line WL, and applying appropriate voltage between them, one memory cell is selected from the memory cell array to write and read data.

(Details of the Transistor 10)

The details of the transistor 10 will be described below.

The transistor 10 includes a source electrode 11 (a bit line BL), the drain electrode 12, a channel layer 13 (an oxide semiconductor layer), a gate electrode 14 (a word line WL), a gate insulation layer 15, an oxide layer 16, a substrate 21, interlayer-insulation layers 22 to 24.

In addition, the transistor 10 has a through hole H penetrating the drain electrode 12, the interlayer-insulation layer 24, the gate electrode 14, and the interlayer-insulation layer 23 and reaching the source electrode 11. The through hole H has a long columnar shape (for example, substantially cylindrical shape) extending in the Z-axis direction, its width (diameter) W0 is, for example, 10 to 50 nm, and its length L0 in the Z-axis direction is, for example, 80 to 350 nm.

The source electrode 11 (an example of the first electrode) and the drain electrode 12 (an example of the second electrode) can be made of a conductive material (for example, metal, metal compound, semiconductor, or conductive oxide). The source electrode 11 and the drain electrode 12 can be made of a composite material (for example, a laminated structure of metal and conductive oxide, or a laminated structure of tungsten (W) and indium tin oxide (ITO)). For example, the channel layer 13 side surfaces of the source electrode 11 and the drain electrode 12 can be made of indium tin oxide. Here, the source electrode 11 forms a part of a bit line BL with a long substantially rectangular parallelepiped shape extending in the X-axis direction (an example of the second direction).

The drain electrode 12 has a substantially disk shape and is connected to the cell electrode 31 of the capacitor 30. A current flowing from the drain electrode 12 to the capacitor 30 injects charge to the capacitor 30.

The channel layer 13 (an example of a semiconductor channel) includes a portion extending along the Z-axis direction (an example of a first direction), is disposed in the through hole H, and electrically connects the source electrode 11 to the drain electrode 12. When the transistor 10 is turned on, a channel is formed in the channel layer 13, serving as a current path.

The channel layer 13 has a pillar shape (for example, a shape combining a substantially cylindrical shape with a substantially disk shape) extending in the Z-axis direction. That is, the channel layer 13 has a disc shape (a disc portion) in the through hole H of the drain electrode 12, and a cylindrical shape (a cylindrical portion) in the through hole H of the interlayer-insulation layer 24, the gate electrode 14, and the interlayer-insulation layer 23. The width (diameter) W2 of the cylindrical portion of the channel layer 13 is narrower than the width (diameter) W1 of the disc portion. This is because the gate insulation layer 15 is disposed between the side wall of the through hole H and the channel layer 13 in the interlayer-insulation layer 24, the gate electrode 14, and the interlayer-insulation layer 23.

The total length L1 of the channel layer 13 is almost identical to the length L0 of the through hole H. The width (diameter) W1 of the disc portion of the channel layer 13 is almost identical to the width W0 of the through hole H. The width (diameter) W2 of the cylindrical portion of the channel layer 13 is, for example, 5 to 40 nm, and the length L2 in the Z-axis direction is, for example, 50 to 300 nm.

The channel layer 13 can be made of an oxide semiconductor, and contain, for example, indium (In). The channel layer 13 includes, for example, indium oxide and gallium oxide, indium oxide and zinc oxide, or indium oxide and tin oxide. The channel layer 13 can be made of, for example, so-called IGZO (InGaZnO) including indium oxide, gallium oxide, and zinc oxide.

The gate electrode 14 is disposed between the source electrode 11 and the drain electrode 12 so as to be spaced apart from them. Here, the gate electrode 14 constitutes a part of a word line WL having a long substantially rectangular parallelepiped shape extending in the Y-axis direction (an example of the third direction). The width W of the gate electrode 14 in the X-axis direction is, for example, 20 to 100 nm, and the thickness D in the Z-axis direction is, for example, 20 to 200 nm.

As described above, the gate electrode 14 has the through hole H, in which the channel layer 13 is disposed. That is, the gate electrode 14 surrounds a part of the outer periphery of the channel layer 13 (and also a part of the gate insulation layer 15 and the oxide layer 16).

The gate electrode 14 is made of, for example, a metal, a metal compound, or a semiconductor. The gate electrode 14 can be made of, for example, any of W, Ti, TiN, and Mo. As described later, the oxide layer 16 contains an oxide of the metal element constituting the gate electrode 14. Forming the oxide layer 16 of an oxide of W, Ti, or Mo enables to shift the threshold voltage to the positive side, and reduce the off-leak current, as described later.

The gate insulation layer 15 (an example of the insulation layer) has a cylindrical shape (for example, a substantially cylindrical shape), is disposed in the through hole H and between the oxide layer 16 and the channel layer 13, and surrounds the perimeter of the channel layer 13. The gate insulation layer 15 is made of, for example, oxide or oxynitride. The thickness d1 (in the direction perpendicular to the axis of the channel layer 13) of the gate insulation layer 15 is, for example, 2 to 20 nm.

The length L3 of the gate insulation layer 15 in the Z-axis direction is almost identical to the length L2 of the cylindrical portion of the channel layer 13, and larger than the thickness D of the gate electrode 14 in the Z-axis direction and the length L4 of the oxide layer 16 in the Z-axis direction. The material of the gate insulation layer 15 is, for example, oxide or nitride (as an example, silicon oxide).

The oxide layer 16 (an example of the oxide layer) has a cylindrical shape (substantially cylindrical shape), is disposed between the gate insulation layer 15 and the gate electrode 14, and covers the outer periphery of the gate insulation layer 15.

The length L4 of the oxide layer 16 in the Z-axis direction is almost identical to the thickness D of the gate electrode 14 (the difference is less than 10%), and less than the length L2 of the cylindrical portion of the channel layer 13 in the Z-axis direction and the length L3 of the gate insulation layer 15 in the Z-axis direction. The thickness d2 (in the direction perpendicular to the axis of the channel layer 13) of the oxide layer 16 is, for example, 1 to 10 nm, more preferably 1 to 5 nm, and still more preferably 1 to 3 nm. As described later, the threshold voltage depends on the thickness d2 of the oxide layer 16.

Here, the boundary between the gate insulation layer 15 and the oxide layer 16 corresponds to the inner wall of the through hole H. That is, the gate insulation layer 15 is disposed in the through hole H, but the oxide layer 16 is disposed outside the through hole H (in the inner wall of the through hole H). The oxide layer 16 is disposed outside the through hole H because the oxide layer 16 is formed by oxidizing the inner wall of the through hole H of the gate electrode 14, as described later. That is, a part of the original gate electrode 14 is oxidized to form the oxide layer 16.

The gate electrode 14 and the oxide layer 16 may be imaginarily combined to be regarded as a gate electrode. In this case, the gate electrode 14 can be the body of the gate electrode, and the oxide layer 16 can be a part of the gate electrode.

The oxide layer 16 can be made of oxide of any one of W, Ti, and Mo. As described above, when the gate electrode 14 is made of W, Ti, TiN, or Mo, the oxide layer 16 becomes oxide of metal constituting these materials. This can reduce gate leak current, as described later.

The substrate 21 is a substrate of semiconductor (for example, silicon).

The interlayer-insulation layers 22 to 24 are respectively disposed between the substrate 21 and the source electrode 11, between the source electrode 11 and the gate electrode 14, and between the gate electrode 14 and the drain electrode 12. The interlayer-insulation layer 24 covers the side and top surfaces of the gate electrode 14. The interlayer-insulation layers 22 to 24 electrically separate the substrate 21, the source electrode 11, the drain electrode 12, and the gate electrode 14 from each other. The interlayer-insulation layer 24 is made of, for example, oxide (as an example, silicon oxide).

(Reduction of Gate Leak Current by Adding the Oxide Layer 16)

Hereinafter, reduction of gate leak current by adding the oxide layer 16 will be described.

The transistor 10 is preferably able to completely shut off the current during its OFF-state (off-leak current being zero). For example, when the memory cell has an off-leak current, the charge (data) stored in the capacitor 30 leaks out to lose the data stored in the capacitor 30 (loss of non-volatile performance in the memory cell). This promotes reduction in off-leak current of the transistor 10, particularly in gate leak current (a current leakage from the gate electrode 14).

The gate leak current can be reduced by making the threshold voltage of the transistor 10 greater than 0 Volt in a very low off-leak current (for example, $1 \times 10^{-20}$ A/µm or less). That is, a negative threshold voltage in the very low off-leak current causes a gate leak current, for example, losing non-volatile performance in the memory cell, even if the transistor 10 is OFF (zero bias: gate voltage being 0 Volt).

The threshold voltage tends to shift to the positive side by adding the oxide layer 16 (for example, an oxide of W, Ti, or Mo, as an example, WOx). This shift can be described as follows.

A. Interface Dipole (Interface Charge)

The difference in the area density of oxygen between the gate insulation layer 15 and the oxide layer 16 forms a dipole (a pair of positive and negative charges) at their boundary. When the area density of oxygen in the oxide layer 16 is larger than that in the gate insulation layer 15, the dipole becomes negative on its oxide layer 16 side, and positive on its gate insulation layer 15 side. This shifts the threshold voltage to positive side (about 0.5 Volt at maximum).

When the gate insulation layer 15 is made of silicon oxide, and the ion radius of the cation (metal) of the oxide layer 16 is 0.6 Å or less, the threshold voltage is shifted to the positive side. From this point of view, an oxide of one of W, Ti, and Mo can be selected for the oxide layer 16. As described later, adding the oxide layer 16 is confirmed to shift the threshold voltage to the positive side. The oxide constituting the oxide layer 16 may be either conductive or insulative.

B. Fixed Bulk Charge

If the oxide layer 16 has a fixed negative charge in it, its threshold voltage shifts to the positive side. As described later, when the oxide layer 16 is made of WOx, the threshold voltage reduces as the thickness d2 of the oxide layer 16 increases. That is, the layer of WOx is considered to have fixed positive charge in it. From the above, when the oxide layer 16 is made of WOx, the interface dipole is basically considered to shift the threshold voltage to the positive side.

Comparative Embodiment

Figure 4:
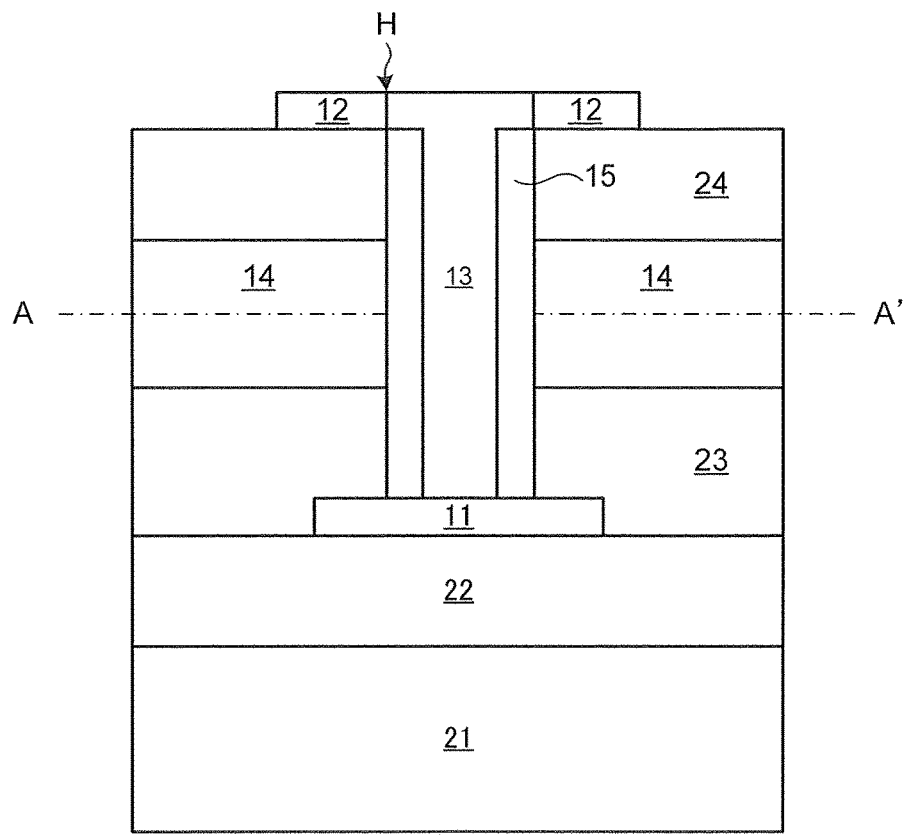
FIG. 4 is a vertical sectional view schematically illustrating a semiconductor device according to a comparative embodiment.
Figure 5:
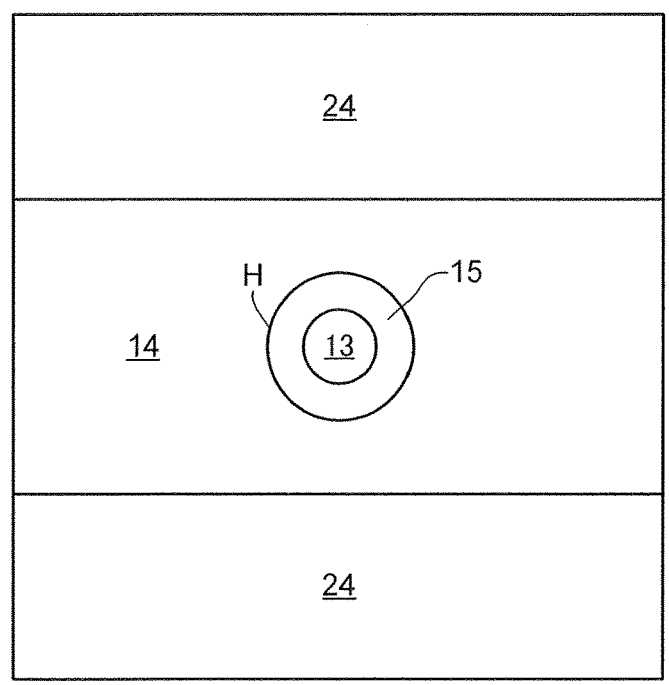
FIG. 5 is a cross sectional view schematically illustrating the semiconductor device according to the comparative embodiment.

FIGS. 4 and 5 illustrate semiconductor devices according to a comparative embodiment, and correspond to FIGS. 2 and 3, respectively. The semiconductor device of the comparative embodiment without the oxide layer 16 has a threshold voltage lower than that of the semiconductor device of the embodiment, and thus a larger off-leak current.

The semiconductor device according to the embodiment has the oxide layer 16. This causes a positive shift of the threshold voltage, and a reduction in the off-leak current. The oxide layer 16 is disposed outside the inner surface of the through hole H, as described above. Comparing with the comparative embodiment, the embodiment can have a threshold voltage shifted to the positive side by adding the oxide layer 16 without changing the size of the transistor 10 (for example, the width W0 of the through hole H is the same).

(Production Method)

Next, an example of the production method of the semiconductor device of the first embodiment will be described.

FIG. 6 to FIG. 9 are schematic cross-sectional views illustrating a method of producing a semiconductor device of the embodiment. FIG. 10 is a flow diagram illustrating a production procedure of a semiconductor device.

Figure 6:
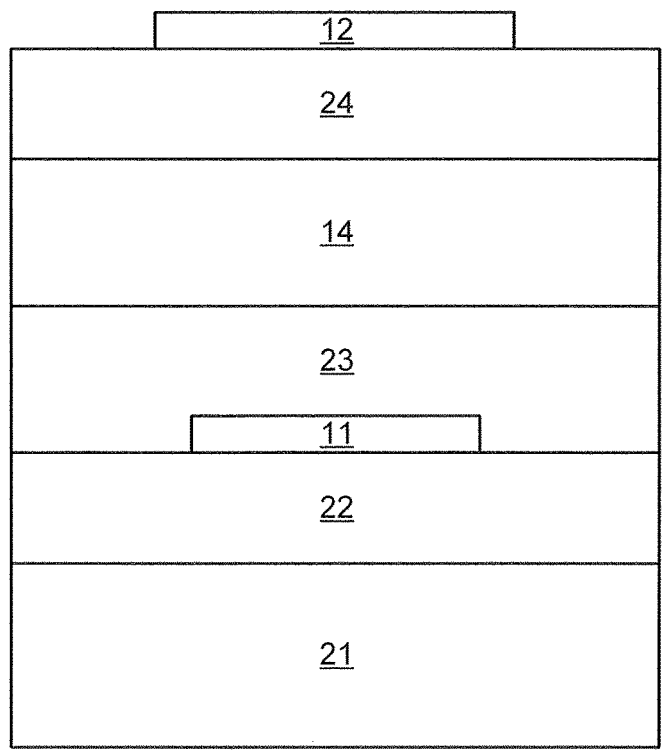
FIGS. 6 to 9 are vertical sectional views schematically illustrating a semiconductor device in a production process.

(1) Formation of a Laminate (Step S11 and FIG. 6)

A laminate is formed, which includes the interlayer-insulation layer 22, the source electrode 11, the interlayer-insulation layer 23, the gate electrode 14, the interlayer-insulation layer 24, and the drain electrode 12, sequentially formed on the substrate 21 as follows.

1) The interlayer-insulation layer 22 is formed on the substrate 21. The interlayer-insulation layer 22 is formed, for example, by depositing a film by a CVD method (chemical vapor deposition method) and flattening by a CMP method (chemical mechanical polishing method). The interlayer-insulation layer 22 is made of, for example, silicon oxide.

2) The source electrode 11 is formed on the interlayer-insulation layer 22. The source electrode 11 is formed, for example, by depositing a film by a CVD method and patterning by a lithography method and a RIE method (Reactive Ion Etching method).

3) The interlayer-insulation layer 23 is formed on the source electrode 11. The interlayer-insulation layer 23 is formed, for example, by depositing a film by a CVD method and flattening by a CMP method. The interlayer-insulation layer 23 is made of, for example, silicon oxide.

4) The gate electrode 14 is formed on the interlayer-insulation layer 23. The gate electrode 14 is formed, for example, by depositing a film by a CVD method and patterning by a lithography method and a RIE method.

5) The interlayer-insulation layer 24 is formed on the gate electrode 14. The interlayer-insulation layer 24 is formed, for example, by depositing a film by a CVD method and flattening by a CMP method.

6) The drain electrode 12 is formed on the interlayer-insulation layer 24 (shown in FIG. 6). The drain electrode 12 is formed, for example, by depositing a film by a CVD method and patterning by a lithography method and an RIE method.

Figure 7:
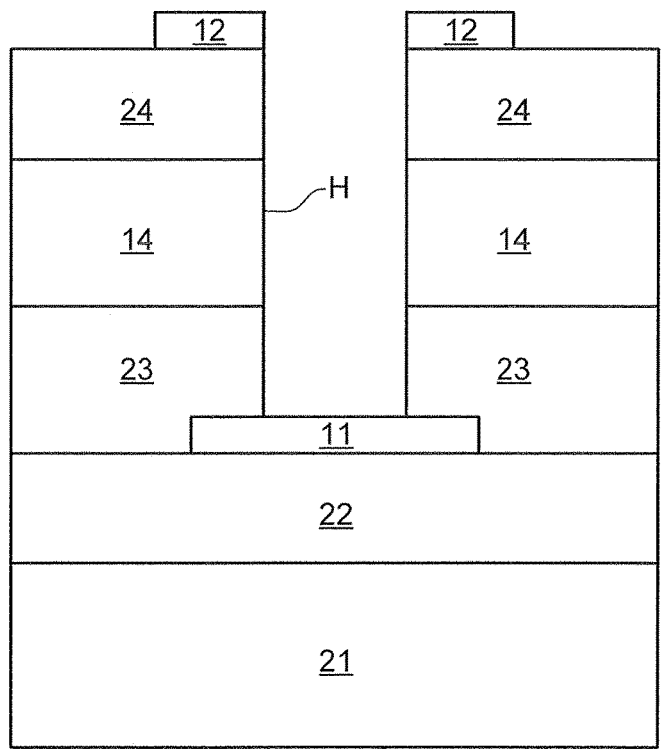

(2) Formation of a Through Hole H (Step S12 and FIG. 7)

The through hole H is formed in the laminate (FIG. 7). That is, the through hole H is formed by penetrating the drain electrode 12, the interlayer-insulation layer 24, the gate electrode 14, and the interlayer-insulation layer 23 to reach the source electrode 11. The through hole H is formed, for example, with patterning by a lithography method and a RIE method.

(3) Formation of an Oxide Layer 16 (Step S13)

The oxide layer 16 is formed along the inner wall of the through hole H. For example, the oxide layer 16 can be formed by oxidizing the gate electrode 14 of the inner wall of the through hole H.

As an example, the substrate 21 (a laminate) is heated to about 100° C. to 500° C., and an oxidizing gas or plasma (for example, oxygen gas, oxygen plasma, or ozone) is introduced into the through hole H. The oxygen plasma can be formed by discharging oxygen gas. The ozone can be formed by irradiating oxygen gas with UV light (UV). Then, the metal element (for example, W, Ti, or Mo) constituting the gate electrode 14 of the inner wall of the through hole H is oxidized to form the oxide layer 16. The oxide layer 16 is located outside the through hole H of the gate electrode 14.

Figure 8:
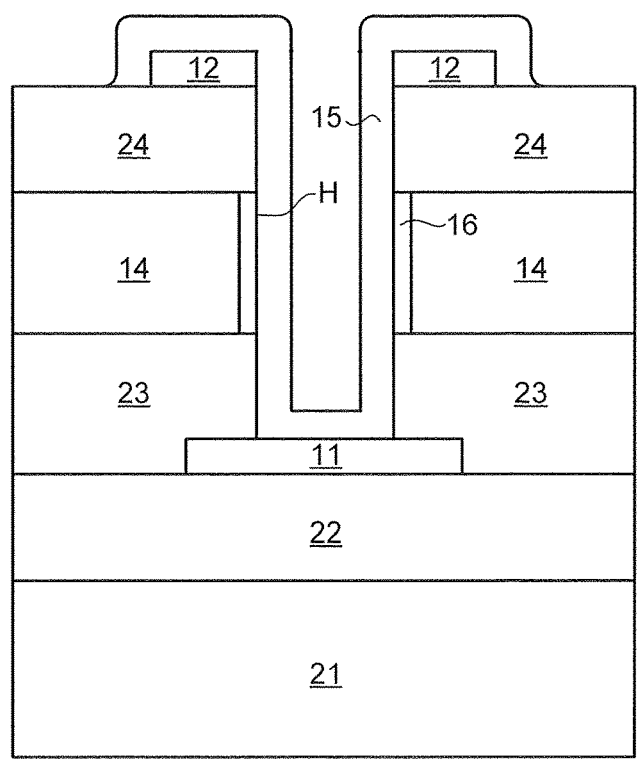

(4) Formation of a Gate Insulation Layer 15 (Step S14 and FIG. 8)

Next, the gate insulation layer 15 is deposited (FIG. 8). The gate insulation layer 15 is deposited, for example, by an ALD method (Atomic Layer Deposition method). The ALD method involves alternately forming and oxidizing a monolayer of the basic constituent material for the gate insulation layer 15, as follows.

1) Supply and Adsorption of Source Gas

A source gas including metal element is supplied and introduced into the through hole H. A part of the source gas is adsorbed in and out of the through hole H to form a monolayer of source gas in the through hole H. The source gas can be, for example, tetrakis(dimethylamino)silane, or Bis(diethylamino)silane.

2) Discharge of Source Gas

The source gas is discharged from within the through hole H. Generally, instead of the source gas, an inert gas (for example, nitrogen gas, or argon gas) is supplied to expel the residual source gas.

3) Oxidation Treatment (for Example, Oxygen Plasma Treatment, or Ozone Treatment)

Oxidizing the adsorbed source gas (a monolayer of the source gas) forms an oxide layer of the metal contained in the source gas. Introducing, for example, oxygen plasma and ozone into the through hole H can oxidize the source gas. The oxygen plasma can be formed by discharging oxygen gas. The ozone can be formed by irradiating oxygen gas with UV light (UV).

Repeating the steps 1) to 3) can form the gate insulation layer 15 with a desired film thickness.

Here, the gate insulation layer 15 is formed by an ALD method, but the gate insulation layer 15 may be formed by another method, for example, a CVD method. The CVD method, can use a source gas of, for example, silane or TEOS (TetraEthylOrthoSilicate).

Figure 9:
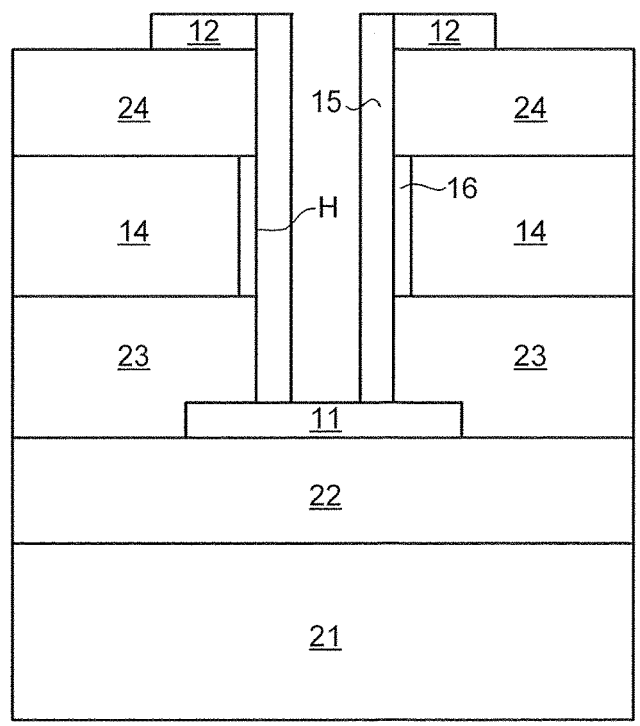
Figure 10:
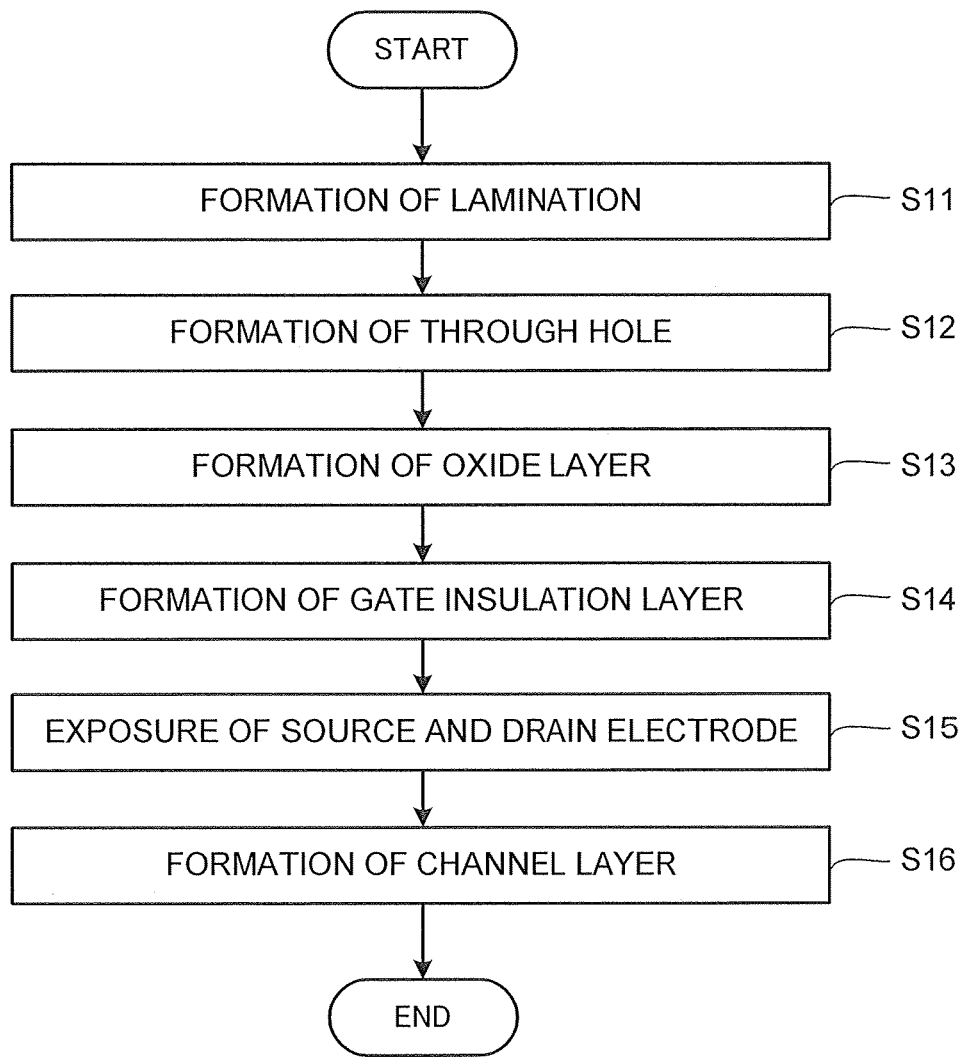
FIG. 10 is a flow diagram illustrating an example of a production process of a semiconductor device.

(5) Exposure of the Source Electrode 11 and the Drain Electrode (Step S15 and FIG. 9)

The gate insulation layer 15 is etched to expose the source electrode 11 and the drain electrode 12. When the gate insulation layer 15 is formed, the source electrode 11 and the drain electrode 12 are covered with the gate insulation layer 15. Thus, the gate insulation layer 15 is etched to expose the source electrode 11 and the drain electrode 12. At this time, the cylindrical inner side wall of the gate insulation layer 15 is also somewhat etched (the side wall is left).

(6) Formation of a Channel Layer 13 (Step S16 and FIG. 2)

The through hole H is embedded with the channel layer 13 (FIG. 2). For example, an oxide semiconductor film (not shown) is deposited by an ALD method, and the channel layer 13 is formed by flattening using a CMP method. Thus, the transistor 10 shown in FIG. 1 to FIG. 3 is formed.

Here, the laminate including the drain electrode 12 is formed, and a through hole H is formed on the laminate to penetrate the drain electrode 12. On the other hand, after forming the laminate without the drain electrode 12, then forming the through hole H, the gate insulation layer 15, and the oxide layer 16, exposing the source electrode 11, and forming the channel layer 13, the drain electrode 12 can be formed.

Figure 11:
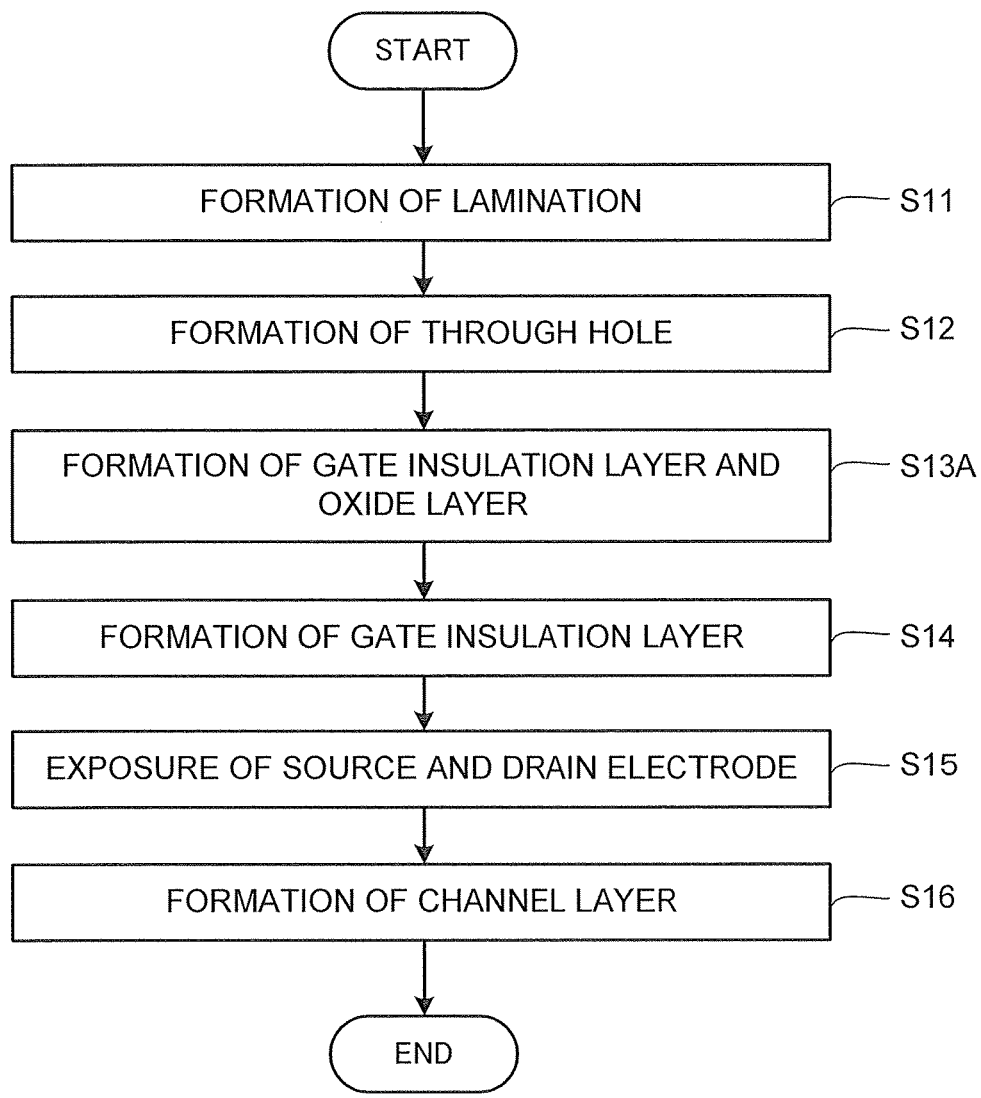
FIG. 11 is a flow diagram illustrating another example of a production process of a semiconductor device.

In addition, the semiconductor device may be formed by the production procedure shown in FIG. 11. That is, the gate insulation layer 15 and the oxide layer 16 can be formed in parallel. In this case, the steps S13 and S14 in FIG. 10 correspond substantially to one process of the step S13A.

For example, after forming the through hole H, the gate insulation layer 15 is formed without the step (step S13 in FIG. 10) of forming the oxide layer 16 itself (step S13A). At this time, if the step of forming the gate insulation layer 15 includes an oxidation process, the gate electrode 14 on the inner wall of the through hole H is oxidized during the formation of the gate insulation layer 15 to form the oxide layer 16.

As an example, the gate insulation layer 15 is formed by an ALD method. As described above, the ALD process involves forming process of a monolayer of the raw material of the gate insulation layer 15 and oxidizing process of the monolayer, alternately performed. Thus, the oxide layer 16 is formed, in parallel with the formation of the gate insulation layer 15. Oxygen for oxidation of the monolayer is diffused through the gate insulation layer 15 to oxidize the constituent material of the gate electrode 14, forming the oxide layer 16.

In an ALD process, the substrate 21 (a laminate) is preferably heated (for example, about 100 to 500° C.). The heating promotes the diffusion of oxygen in the gate insulation layer 15.

Thus, the oxide layer 16 can be formed by a method of sequentially forming the oxide layer 16 and the gate insulation layer 15 (the method A described later), or another method of forming the oxide layer 16 and the gate insulation layer 15 in parallel (the method B described later).

Example

Placing the oxide layer 16 between the gate electrode 14 and the gate insulation layer 15 experimentally results in an increase in the threshold voltage of the transistor 10.

A transistor without the oxide layer 16 (comparative examples: corresponding to the comparable embodiment) and a transistor with the oxide layer 16 (examples: corresponding to the embodiment) were formed. However, for ease of experiment, the transistor is not vertical type but flat type.

Here, neither the comparative example nor the example has a process of forming only the oxide layer 16. The comparative examples and the examples have a difference between them in that the gate insulation layer 15 of the former is formed by a CVD method while the gate insulation layer 15 of the latter is formed by an ALD method. The difference between the methods of forming the gate insulation layer 15 leads to the presence or absence of the oxide layer 16.

Figure 12:
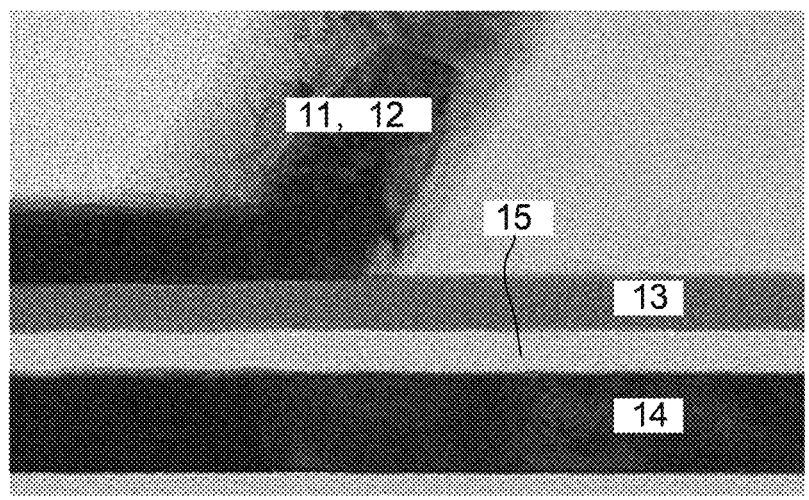
FIG. 12 is a TEM cross-sectional photograph of a semiconductor device according to a comparative example.
Figure 13:
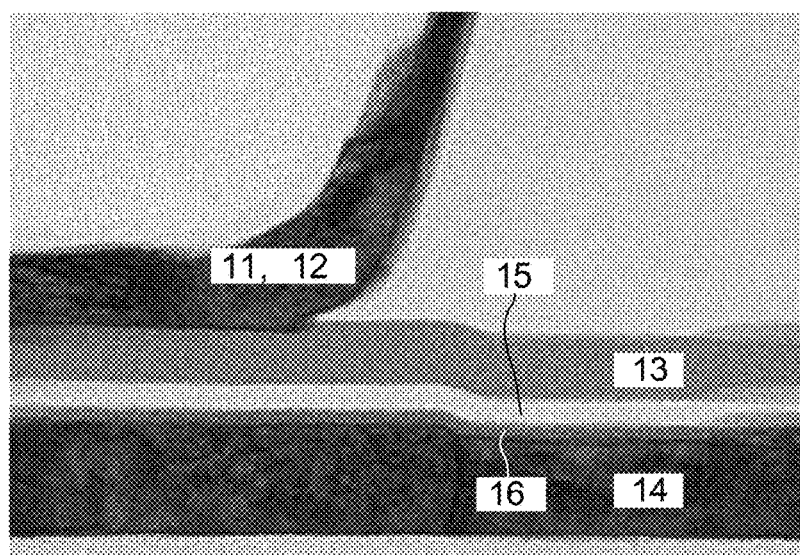
FIG. 13 is a TEM cross-sectional photograph of a semiconductor device according to an example.

FIG. 12 and FIG. 13 are cross-sectional TEM (transmission electron microscope) photographs of a transistor according to the comparative example and the example, respectively. In the comparative example, the gate insulation layer 15 and the channel layer 13 are arranged in order on the gate electrode 14 (formed by W), and the source and drain electrodes 11 and 12 are arranged on the channel layer 13. For ease of viewing the layer structure, the magnification is increased, so the FIGS. illustrate only one of the source and drain electrodes 11 and 12. In the example, the oxide layer 16 is disposed between the gate electrode 14 and the gate insulation layer 15.

Figure 14:
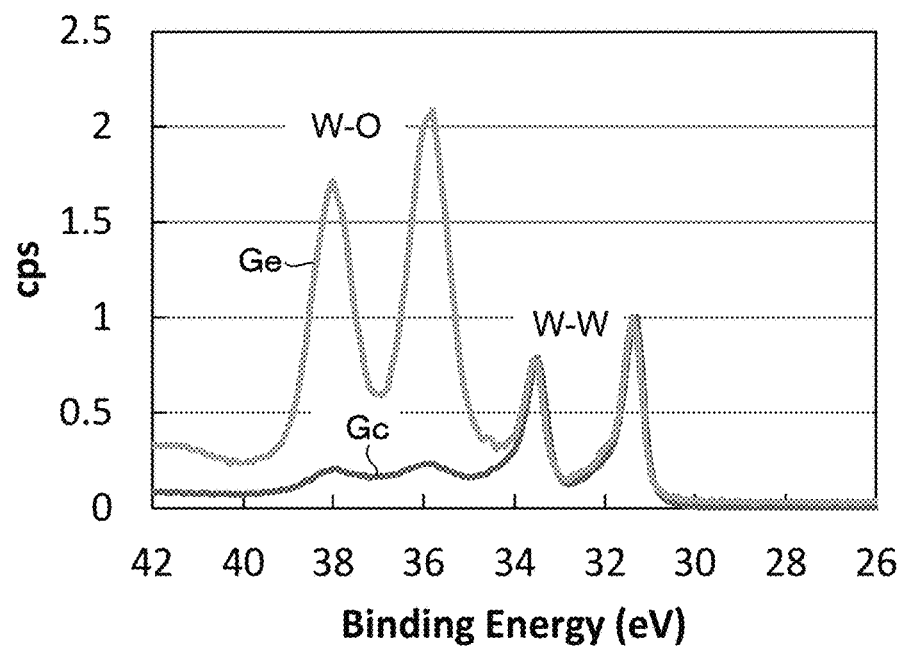
FIG. 14 is a graph illustrating XPS results of semiconductor devices.

FIG. 14 is a graph illustrating results of XPS (X-ray photoelectron spectroscopy). Graphs Gc and Ge correspond to the comparative example and the example, respectively. Graph Gc of the comparative example illustrates a large peak corresponding to the binding energy between tungsten atoms (W—W), but a very small peak corresponding to the binding energy between tungsten and oxygen atoms (W—O). On the other hand, Graph Ge of the example illustrates two large peaks corresponding to the binding energies between tungsten atoms (W—W) and between tungsten and oxygen atoms (W—O). That is, the oxide layer 16 is considered to be oxidized W of a constituent material of the gate electrode 14.

From the above, in the example, W constituting the gate electrode 14 is considered to be oxidized by oxygen plasma used in an ALD process during the formation of the gate insulation layer 15. That is, in the example, the gate insulation layer 15 is formed simultaneously with the formation of the oxide layer 16 (layer of WOx). On the other hand, in the comparative example, only the gate insulation layer 15 is formed by CVD, and the oxide layer 16 is not formed.

Figure 15:
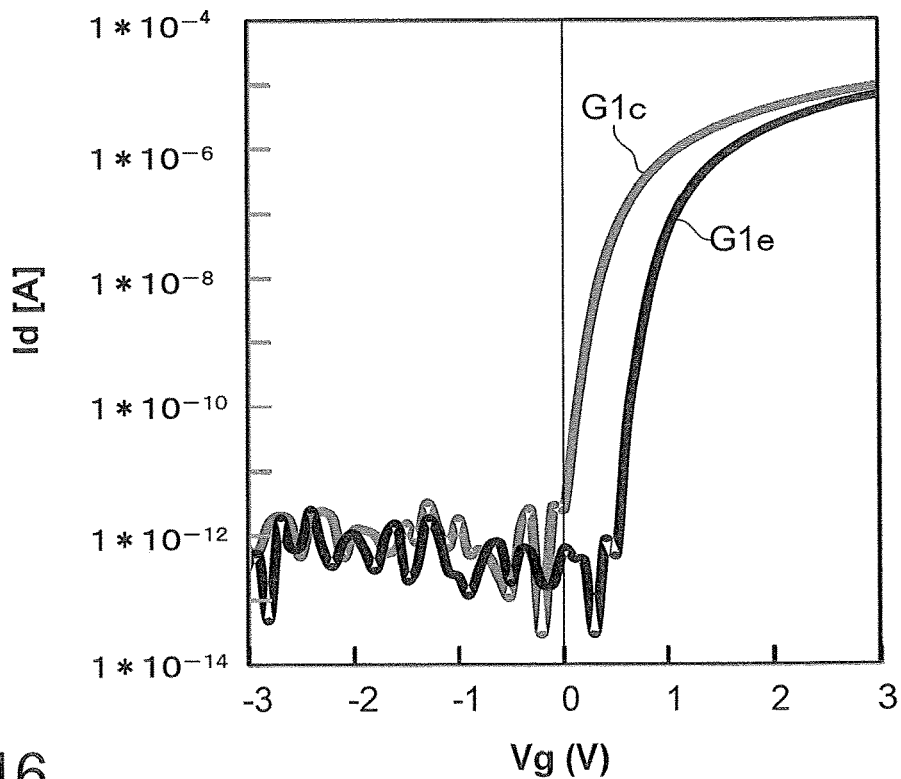
FIG. 15 is a graph illustrating gate voltage-drain current characteristics of semiconductor devices.

FIG. 15 is a graph illustrating measurement results of the gate voltage Vg versus the drain current Id in the comparative example and the example. Graphs G1c and G1e illustrate measurement results of comparative examples and examples, respectively.

The threshold voltage in the comparative examples is near 0 Volt whereas the threshold voltage in the example is positive, by a so-called DC measurement.

The threshold voltages in very low off-leak current may be different from that by the DC (for example, the threshold voltage may shift to the negative side). Considering this, the threshold voltage of near 0 Volt in the comparative example may be not sufficient to reduce the extremely low off-leak current. On the other hand, in the example, the threshold voltage in the DC is largely shifted to the positive side. So, the examples can be expected better than the comparative example also in the extremely low off-leak current.

As described above, the addition of the oxide layer 16 (here, WOx) experimentally tends to shift the threshold voltage to the positive side.

Next, the film thickness d2 of the oxide layer 16 was changed.

As mentioned, the two methods can be used to form the oxide layer 16: the following methods A and B to form the oxide layer 16 (here, WOx).

Method A) The substrate 21 (a laminate) is exposed to oxygen gas in a heated state. Then, the gate electrode 14 (here, W) is oxidized to form the oxide layer 16 (WOx). After that, the gate insulation layer 15 (here, a silicon oxide layer) is formed by a CVD method.

Method B) While heating the substrate 21 (a laminate), the gate insulation layer 15 (here, silicon oxide layer) is formed by an ALD method. Thus, the gate electrode 14 (here, W) is oxidized to form the oxide layer 16 (WOx).

In the method A, the oxidation treatment temperature (the temperature of the substrate 21, that is, the laminate) was changed from 200° C. to 400° C. In the method B, the oxidation treatment temperature was constant at 200° C.

Figure 16:
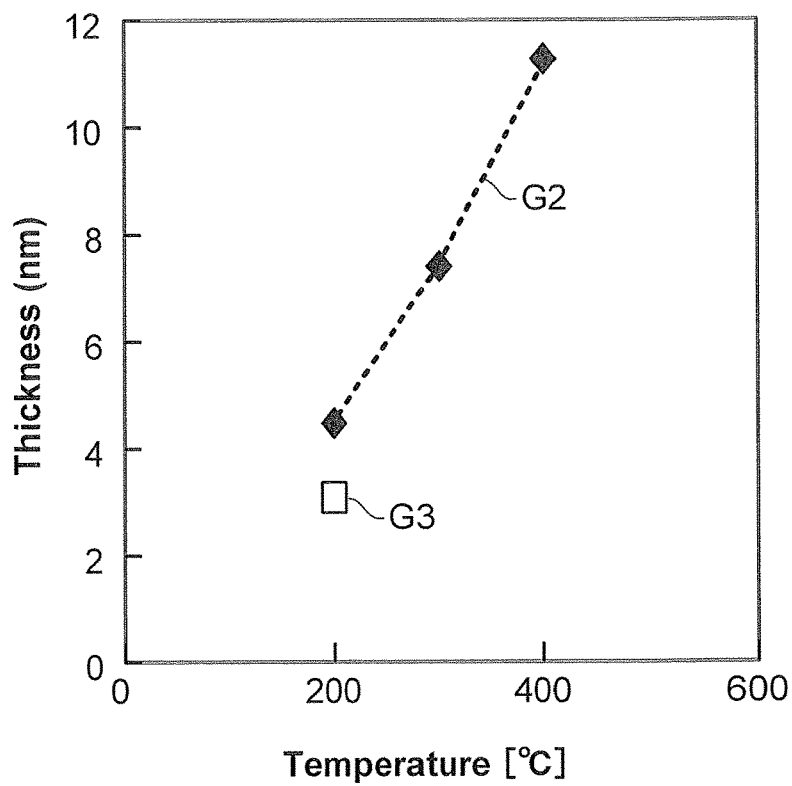
FIG. 16 is a graph illustrating the relationship between the temperature and the oxide layer thickness.

FIG. 16 is a graph illustrating the relationship between the temperature of the substrate 21 and the thickness d2 of the oxide layer 16. Graphs G2 and G3 correspond to methods A and B, respectively.

As shown in Graph G2, as the temperature increases, the thickness d2 of the oxide layer 16 also increases. In addition, as shown in Graph G3, the thickness d2 of the oxide layer 16 by the method B is slightly thinner than that by the method A, even at the same temperature (200° C.). This reason is considered that in the method B oxygen is supplied to the gate electrode 14 through the gate insulation layer 15.

Figure 17:
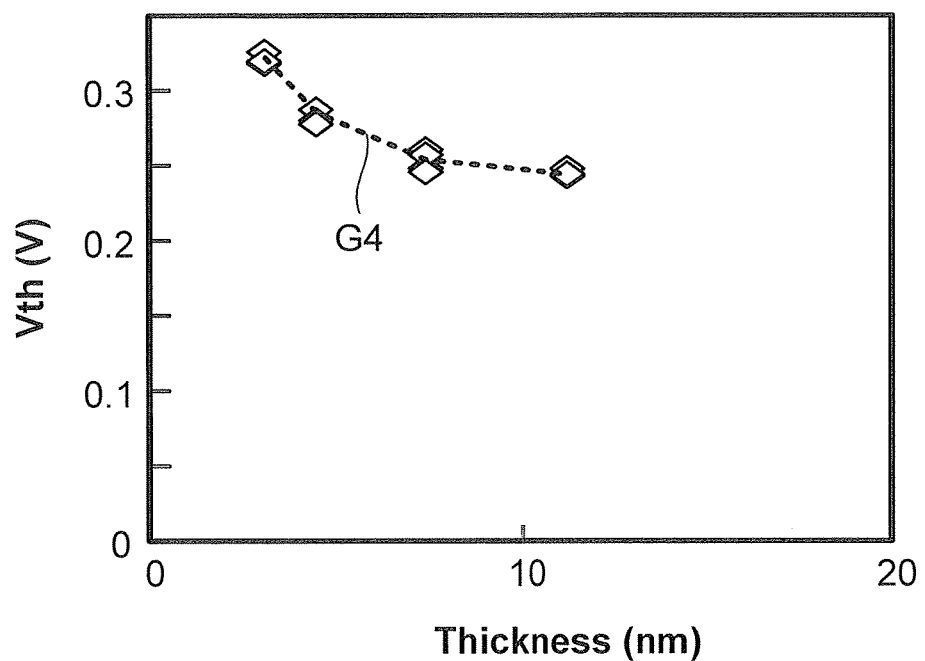
FIG. 17 is a graph illustrating the relationship between the oxide layer thickness and the threshold voltage.

FIG. 17 is a graph illustrating the relationship between the thickness d2 of the oxide layer 16 and the threshold voltage. As shown in Graph G4, the thicker the thickness d2 is, the more the threshold voltage tends to shift to the negative side. This is considered to be due to the presence of fixed positive charge in the oxide layer 16.

As described above, adding the oxide layer 16 of WOx shifts the threshold voltage to the positive side, but as the thickness d2 becomes too thicker, the shift tend to turn to the negative side again. That is, the thickness d2 of the oxide layer 16 of WOx can be about 1 to 10 nm, preferably about 1 to 5 nm (more preferably about 1 to 3 nm). The thickness d2 of the oxide layer 16 (forming in parallel with the gate insulation layer 15) by the method B is about 3 nm, which corresponds to the above-mentioned preferable range (about 1 to 3 nm).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first electrode and a second electrode;
an oxide semiconductor channel including a portion extending along a first direction and connecting the first electrode to the second electrode;
an insulation layer surrounding the oxide semiconductor channel;
an oxide layer covering the oxide semiconductor channel and the insulation layer, the oxide layer including an oxide of a metal element; and
a gate electrode covering the oxide semiconductor channel, the insulation layer, and the oxide layer, the gate electrode including the metal element, wherein the oxide layer has a thickness of 1 nm to 10 nm in a direction perpendicular to the first direction.

2. The device according to claim 1, wherein the oxide layer has a length in the first direction shorter than that of the insulation layer in the first direction.

3. The device according to claim 2, wherein the length of the oxide layer in the first direction is identical to a length of the gate electrode in the first direction.

4. The device according to claim 1, wherein a XPS spectrum of the oxide layer has a metal-metal binding peak and a metal-oxygen binding peak greater than the metal-metal binding peak.

5. The device according to claim 1, wherein the metal element contains at least one of W, Ti, or Mo.

6. The device according to claim 1, wherein the oxide semiconductor channel contains indium oxide, gallium oxide, and zinc oxide.

7. The device according to claim 1, further comprising a capacitor electrically connected to the second electrode.

8. A semiconductor device, comprising:
a plurality of bit lines extending along a first direction;
a plurality of word lines extending along a second direction intersecting the first direction; and
a plurality of semiconductor devices, each comprising:
a first electrode connected to one of the plurality of bit lines,
a second electrode,
an oxide semiconductor channel including a portion extending along a third direction intersecting the first and second directions, the oxide semiconductor channel connecting the first electrode to the second electrode, an insulation layer surrounding the oxide semiconductor channel, an oxide layer covering the oxide semiconductor channel and the insulation layer, the oxide layer including an oxide of a metal element, and a gate electrode connected to one of the plurality of word lines, the gate electrode covering the oxide semiconductor channel, the insulation layer, and the oxide layer, the gate electrode including the metal element, wherein the oxide layer has a thickness of 1 nm to 10 nm in a direction perpendicular to the first direction.

9. The device according to claim 8, wherein the oxide layer has a length in the first direction shorter than that of the insulation layer in the first direction.

10. The device according to claim 9, wherein the length of the oxide layer in the first direction is identical to a length of the gate electrode in the first direction.

11. The device according to claim 8, wherein a XPS spectrum of the oxide layer has a metal-metal binding peak and a metal-oxygen binding peak greater than the metal-metal binding peak.

12. The device according to claim 8, wherein the metal element contains at least one of W, Ti, or Mo.

13. The device according to claim 8, wherein the oxide semiconductor channel contains indium oxide, gallium oxide, and zinc oxide.

14. The device according to claim 8, further comprising a capacitor electrically connected to the second electrode.

15. A semiconductor device comprising:
a first electrode and a second electrode;
an oxide semiconductor channel including a portion extending along a first direction and connecting the first electrode to the second electrode;
an insulation layer surrounding the oxide semiconductor channel;
an oxide layer covering the oxide semiconductor channel and the insulation layer, the oxide layer including an oxide of a metal element; and
a gate electrode covering the oxide semiconductor channel, the insulation layer, and the oxide layer, the gate electrode including the metal element, wherein
a XPS spectrum of the oxide layer has a metal-metal binding peak and a metal-oxygen binding peak greater than the metal-metal binding peak.

16. The device according to claim 15, wherein the oxide layer has a length in the first direction shorter than that of the insulation layer in the first direction.

17. The device according to claim 16, wherein the length of the oxide layer in the first direction is identical to a length of the gate electrode in the first direction.

18. The device according to claim 15, wherein the metal element contains at least one of W, Ti, or Mo.

19. The device according to claim 15, wherein the oxide semiconductor channel contains indium oxide, gallium oxide, and zinc oxide.

20. The device according to claim 15, further comprising a capacitor electrically connected to the second electrode.

21. A semiconductor device, comprising:
a plurality of bit lines extending along a first direction;
a plurality of word lines extending along a second direction intersecting the first direction; and
a plurality of semiconductor devices, each comprising:
a first electrode connected to one of the plurality of bit lines,
a second electrode,
an oxide semiconductor channel including a portion extending along a third direction intersecting the first and second directions, the oxide semiconductor channel connecting the first electrode to the second electrode,
an insulation layer surrounding the oxide semiconductor channel,
an oxide layer covering the oxide semiconductor channel and the insulation layer, the oxide layer including an oxide of a metal element, and
a gate electrode connected to one of the plurality of word lines, the gate electrode covering the oxide semiconductor channel, the insulation layer, and the oxide layer, the gate electrode including the metal element, wherein
a XPS spectrum of the oxide layer has a metal-metal binding peak and a metal-oxygen binding peak greater than the metal-metal binding peak.

22. The device according to claim 21, wherein the oxide layer has a length in the first direction shorter than that of the insulation layer in the first direction.

23. The device according to claim 22, wherein the length of the oxide layer in the first direction is identical to a length of the gate electrode in the first direction.

24. The device according to claim 21, wherein the metal element contains at least one of W, Ti, or Mo.

25. The device according to claim 21, wherein the oxide semiconductor channel contains indium oxide, gallium oxide, and zinc oxide.

26. The device according to claim 21, further comprising a capacitor electrically connected to the second electrode.

* * * * *